US011032027B2

(12) United States Patent
Murakami et al.

(10) Patent No.: US 11,032,027 B2
(45) Date of Patent: *Jun. 8, 2021

(54) TRANSMITTING DEVICE FOR PERFORMING AN ENCODING PROCESS ON AN INFORMATION BIT SEQUENCE USING A CODING SCHEME SELECTED FROM A CODING SCHEME SET

(71) Applicant: Panasonic Intellectual Property Corporation of America, Torrance, CA (US)

(72) Inventors: Yutaka Murakami, Kanagawa (JP); Tomohiro Kimura, Osaka (JP); Mikihiro Ouchi, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/527,609

(22) Filed: Jul. 31, 2019

(65) Prior Publication Data

US 2019/0356419 A1 Nov. 21, 2019

Related U.S. Application Data

(63) Continuation of application No. 15/175,379, filed on Jun. 7, 2016, now Pat. No. 10,411,835, which is a (Continued)

(30) Foreign Application Priority Data

Dec. 8, 2014 (JP) .................................. 2014-248149

(51) Int. Cl.
*H04L 1/00* (2006.01)
*H03M 13/11* (2006.01)
(Continued)

(52) U.S. Cl.
CPC ....... *H04L 1/0068* (2013.01); *H03M 13/1102* (2013.01); *H03M 13/2906* (2013.01); (Continued)

(58) Field of Classification Search
CPC ................. H04L 1/0041; H04L 1/0042; H04L 1/0045; H04L 1/57; H04L 1/0068; H03M 13/1102; H03M 13/616; H03M 13/2906
See application file for complete search history.

(56) References Cited

U.S. PATENT DOCUMENTS 8,874,985 B2 * 10/2014 Goto ..................... H04L 1/1819
714/749
2004/0098659 A1 5/2004 Bjerke et al.
(Continued)

FOREIGN PATENT DOCUMENTS

| CN | 1937479 | 3/2007 |
| JP | 2008-153760 | 7/2008 |

(Continued)

OTHER PUBLICATIONS

International Search Report of PCT application No. PCT/JP2014/006253 dated Jan. 27, 2015.
(Continued)

*Primary Examiner* — Shelly A Chase
(74) *Attorney, Agent, or Firm* — Wenderoth, Lind & Ponack, L.L.P.

(57) ABSTRACT

One coding method of a plurality of coding methods including at least a first coding method and a second coding method is selected, an information sequence is encoded by using the selected coding method, and an encoded sequence obtained by performing predetermined processing on the information sequence is modulated and transmitted. The first coding method is a coding method having a first coding rate, for generating a first encoded sequence by performing
(Continued)

puncturing processing on a generated first codeword by using a first parity check matrix. The second coding method is a coding method having a second coding rate, for generating a second encoded sequence by performing puncturing processing on a generated second codeword by using a second parity check matrix that is different from the first parity check matrix, the second coding rate after the puncturing process being different from the first coding rate.

2 Claims, 11 Drawing Sheets

Related U.S. Application Data continuation of application No. PCT/JP2014/006253, filed on Dec. 16, 2014.

(60) Provisional application No. 61/921,260, filed on Dec. 27, 2013.

(51) Int. Cl.
  *H03M 13/00* (2006.01)
  *H03M 13/29* (2006.01)

(52) U.S. Cl.
  CPC ..... *H03M 13/616* (2013.01); *H03M 13/6362* (2013.01); *H03M 13/6516* (2013.01); *H04L 1/0009* (2013.01); *H04L 1/0041* (2013.01); *H04L 1/0045* (2013.01); *H04L 1/0057* (2013.01)

(56) References Cited

U.S. PATENT DOCUMENTS

| | | | |
|---|---|---|---|
| 2005/0276344 A1 | 12/2005 | Ling et al. | |
| 2006/0120481 A1 | 6/2006 | Hong | |
| 2007/0041458 A1* | 2/2007 | Hocevar | H04L 1/0057 375/260 |
| 2008/0028273 A1 | 1/2008 | Jeong | |
| 2008/0204286 A1 | 8/2008 | Kose | |
| 2010/0325511 A1 | 12/2010 | Oh et al. | |
| 2013/0139025 A1 | 5/2013 | Gioulekas | |

FOREIGN PATENT DOCUMENTS

| | | |
|---|---|---|
| JP | 2010-063111 | 3/2010 |
| JP | 2010-520666 | 6/2010 |

OTHER PUBLICATIONS

DVB Document A122, Frame structure channel coding and modulation for a second generation digital terrestrial television broadcasting system (DVB-T2), Jun. 2008.
Qiuju Diao et al., "LDPC codes on partial geometries: Construction, trapping set structure, and puncturing", IEEE Transaction on Information Theory, vol. 59, No. 12, pp. 7898-7914, Dec. 2013.
Extended European Search Report dated Nov. 22, 2016 in corresponding European Application No. 14874746.2.
Oksman V., et al., "G.hn: The New ITU-T Home Networking Standard", IEEE Communications Magazine, IEEE Service Center, Piscataway, US, vol. 47, No. 10, Oct. 1, 2009, pp. 138-145, XP011283328.
Baldi M., et al., "Variable Rate LDPC Codes for Wireless Applications", IEEE International Conference on Software in Telecommunications and Computer Networks, Sep. 29, 2006, pp. 1-5, XP002579565.
ITU-T G.9960 Telecommunication Standardization Sector of ITU: "ITU-T Unified high-speed wireline-based home networking transceivers—System architecture and physical layer specification", Series G: Transmission Systems and Media, Digital Systems and Networks, Dec. 31, 2011, pp. 1-160, XP055211279, Retrieved from the Internet: URL:https://www.itu.int/rec/T-REC-G.9960-201112-S/en.
Office Action dated Apr. 15, 2019 in Chinese Patent Application No. 201480063860.8 (with English translation of Search Report).

* cited by examiner

FIG. 5

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z = 8100 BITS | METHOD #A | METHOD #A | METHOD #A | METHOD #A | METHOD #A | METHOD #A | METHOD #A | METHOD #A | METHOD #A |
| z = 16200 BITS | METHOD #A | METHOD #A | METHOD #A | METHOD #A | METHOD #A | METHOD #A | METHOD #A | METHOD #A | METHOD #A |
| z = 64800 BITS | METHOD #B | METHOD #B | METHOD #B | METHOD #B | METHOD #B | METHOD #B | METHOD #B | METHOD #B | METHOD #B |

FIG. 6

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z = 8100 BITS | METHOD #A | METHOD #A | METHOD #A | METHOD #A | METHOD #A | METHOD #A | METHOD #A | METHOD #A | METHOD #A |
| z = 16200 BITS | METHOD #B | METHOD #B | METHOD #B | METHOD #B | METHOD #B | METHOD #B | METHOD #B | METHOD #B | METHOD #B |
| z = 64800 BITS | METHOD #B | METHOD #B | METHOD #B | METHOD #B | METHOD #B | METHOD #B | METHOD #B | METHOD #B | METHOD #B |

FIG. 7

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z IS BETWEEN 1000 BITS AND 9000 BITS | METHOD #A | METHOD #A | METHOD #A | METHOD #A | METHOD #A | METHOD #A | METHOD #A | METHOD #A | METHOD #A |
| z IS BETWEEN 10000 BITS AND 20000 BITS | METHOD #A | METHOD #A | METHOD #A | METHOD #A | METHOD #A | METHOD #A | METHOD #A | METHOD #A | METHOD #A |
| z IS BETWEEN 50000 BITS AND 70000 BITS | METHOD #B | METHOD #B | METHOD #B | METHOD #B | METHOD #B | METHOD #B | METHOD #B | METHOD #B | METHOD #B |

FIG. 8

| | CODING RATE 5/15 | CODING RATE 6/15 | CODING RATE 7/15 | CODING RATE 8/15 | CODING RATE 9/15 | CODING RATE 10/15 | CODING RATE 11/15 | CODING RATE 12/15 | CODING RATE 13/15 |
|---|---|---|---|---|---|---|---|---|---|
| z IS BETWEEN 1000 BITS AND 9000 BITS | METHOD #A | METHOD #A | METHOD #A | METHOD #A | METHOD #A | METHOD #A | METHOD #A | METHOD #A | METHOD #A |
| z IS BETWEEN 10000 BITS AND 20000 BITS | METHOD #B | METHOD #B | METHOD #B | METHOD #B | METHOD #B | METHOD #B | METHOD #B | METHOD #B | METHOD #B |
| z IS BETWEEN 50000 BITS AND 70000 BITS | METHOD #B | METHOD #B | METHOD #B | METHOD #B | METHOD #B | METHOD #B | METHOD #B | METHOD #B | METHOD #B |

FIG. 9

| z IS LESS THAN 20000 BITS | METHOD #A |
|---|---|
| z IS 20000 BITS OR MORE | METHOD #B |

FIG. 10

| z IS LESS THAN 10000 BITS | METHOD #A |
|---|---|
| z IS 10000 BITS OR MORE | METHOD #B |

FIG. 12

| LESS THAN CODING RATE f | METHOD #B |
| --- | --- |
| BETWEEN CODING RATES e AND f | METHOD #A |
| HIGHER THAN CODING RATE f | METHOD #B |

FIG. 13

| LESS THAN CODING RATE g | METHOD #B |
| --- | --- |
| CODING RATE g OR MORE | METHOD #A |

FIG. 14

| LESS THAN CODING RATE h | METHOD #A |
| --- | --- |
| CODING RATE h OR MORE | METHOD #B |

TRANSMITTING DEVICE FOR PERFORMING AN ENCODING PROCESS ON AN INFORMATION BIT SEQUENCE USING A CODING SCHEME SELECTED FROM A CODING SCHEME SET

BACKGROUND

1. Technical Field

The present disclosure relates to a broadcast and communication system which uses error correction codes.

2. Description of the Related Art

In a broadcast and communication system which uses radio waves and cables, error correction codes are used to improve data reception quality in a receiving device. In this case, by taking into account an arithmetic operation scale, it is desirable to use an error correction code having high correction performance. In such a situation, using an LDPC (Low-Density Parity-Check) code in a broadcast and communication system which uses radio waves and cables has been studied. Taking into account that an amount of data transmitted by a transmitting device is variable, and environment of use (reception in mobile environment or reception in semi-fixed environment), configuring a system by varying a block length (code length) of an LDPC code and a coding rate has been studied.

In this regard, an LDPC code generating method has been variously studied. For example, NPL 1 discloses encoding an information sequence and generating and transmitting a codeword of N bits by using an LDPC code defined by parity check matrix H1 (in this regard, a number of columns is N).

Further, NPL 2 discloses encoding an information sequence and generating a codeword of L bits by using an LDPC code defined by parity check matrix H2 (in this regard, a number of columns is L and a relationship of N<L holds). Furthermore, NPL 2 discloses determining L−N bits which are not transmitted among the codeword of the L bits, and transmitting a sequence of a rest of N bits (puncturing method).

CITATION LIST

Patent Literature

NPL 1: DVB Document A122, Frame structure channel coding and modulation for a second generation digital terrestrial television broadcasting system (DVB-T2), June 2008.

NPL 2: Q. Diao, Y. Y. Tai, S. Lin, and K. Abdel-Ghaffar, "LDPC codes on partial geometries: Construction, trapping set structure, and puncturing", IEEE Transaction on Information Theory, vol. 59, no. 12, pp. 7898-7914, December 2013.

SUMMARY OF THE INVENTION

In one general aspect, the techniques disclosed here feature a transmitting method according to one aspect of the present disclosure including: selecting one coding method of a plurality of coding methods including at least a first coding method and a second coding method, encoding an information sequence by using the selected coding method, and modulating and transmitting an encoded sequence obtained by performing predetermined processing on the encoded information sequence. The first coding method is a coding method having a first coding rate, for generating a first encoded sequence by encoding a generated first codeword by using a first parity check matrix. The second coding method is a coding method having a second coding rate, for generating a second encoded sequence by performing puncturing processing on a generated second codeword by using a second parity check matrix that is different from the first parity check matrix, the second coding rate after the puncturing process being different from the first coding rate. Further, a number of bits of the first encoded sequence is equal to a number of bits of the second encoded sequence.

A receiving method according to one aspect of the present disclosure includes demodulating a received signal, and performing error correction decoding by using a plurality of generated reception values. In a case where a plurality of reception values have been encoded by a first coding method, the receiving method further includes applying a first decoding method that corresponds to the first coding method, to a plurality of reception values. In a case where a plurality of reception values have been encoded by a second coding method, the receiving method further includes applying depuncturing processing to a plurality of reception values, and applying a second decoding method that corresponds to the second coding method, to a plurality of reception values that have been subjected to the depuncturing processing. The first coding method is a coding method having a first coding rate, for generating a first encoded sequence by encoding a generated first codeword using a first parity check matrix. The second coding method is a coding method having a second coding rate, for generating a second encoded sequence by performing puncturing processing on a generated second codeword by using a second parity check matrix that is different from the first parity check matrix, the second coding rate after the puncturing process being different from the first coding rate. Further, a number of bits of the first encoded sequence is equal to a number of bits of the second encoded sequence.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF DRAWINGS

FIG. 5 is a view illustrating an example of a coding method selected based on a code length and a coding rate;

FIG. 6 is a view illustrating an example of a coding method selected based on a code length and a coding rate;

FIG. 7 is a view illustrating an example of a coding method selected based on a code length and a coding rate;

FIG. 8 is a view illustrating an example of a coding method selected based on a code length and a coding rate;

FIG. 9 is a view illustrating an example of a coding method selected based on a code length;

FIG. 10 is a view illustrating an example of a coding method selected based on a code length;

FIG. 12 is a view illustrating an example of a coding method selected based on a coding rate;

FIG. 13 is a view illustrating an example of a coding method selected based on a coding rate; and FIG. 14 is a view illustrating an example of a coding method selected based on a coding rate.

DETAILED DESCRIPTION

The present disclosure relates to a setting of an LDPC code used by a broadcast and communication system such that a receiving device provides higher data reception quality in the broadcast and communication system having a variable block length (code length) and a variable coding rate and uses radio waves and cables.

Figure 1:
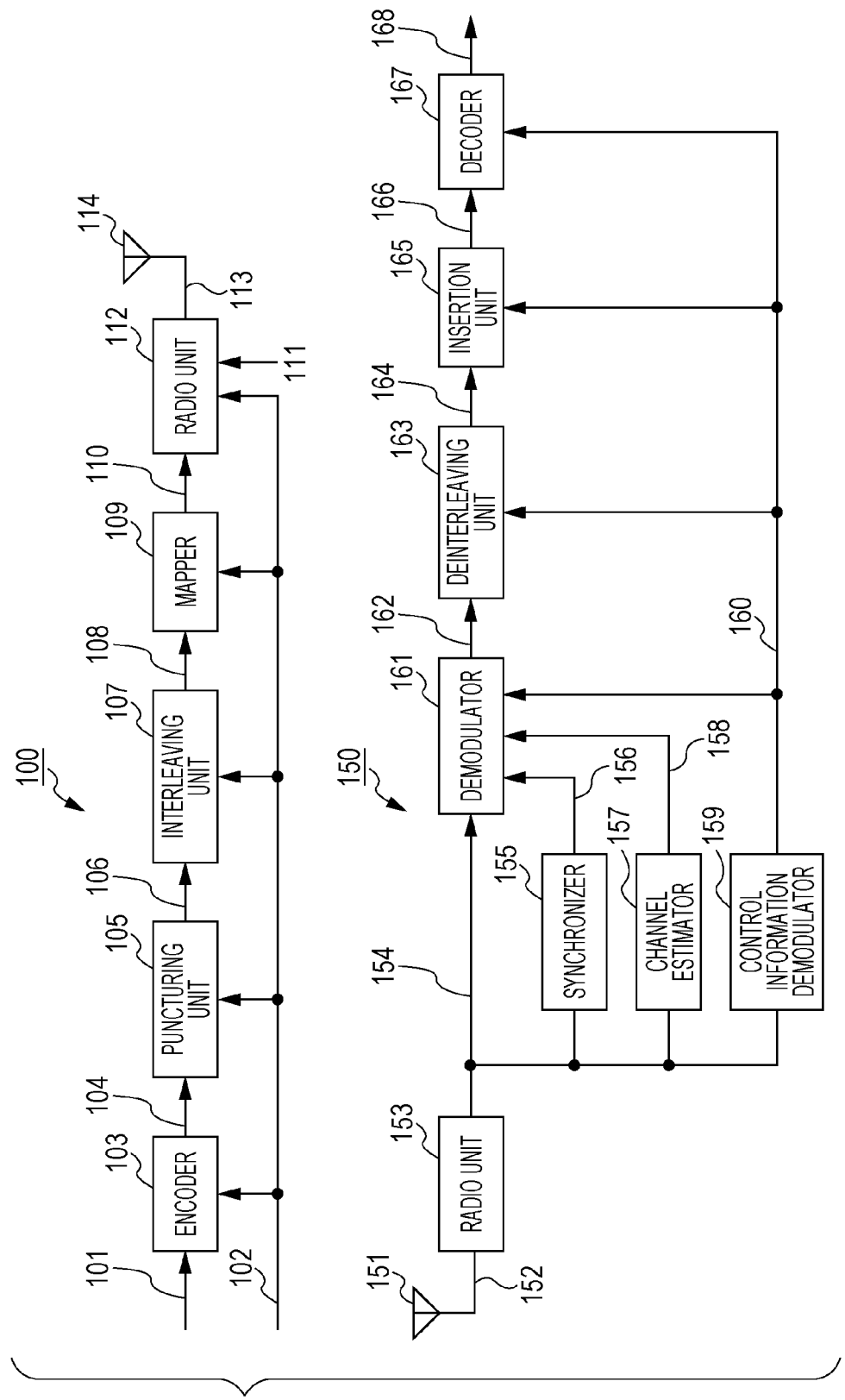
FIG. 1 is a view illustrating a configuration of a receiving device and a transmitting device which use radio waves.

FIG. 1 illustrates an example of a configuration of a system which includes transmitting device 100 and receiving device 150, and uses radio waves. In addition, FIG. 1 illustrates the system which uses radio waves. The present disclosure is not limited to this, and may be a system which uses cables (coaxial cables, cables or optical fiber).

Encoder 103 receives an input of information 101 and control information 102, performs error correction coding based on information of a code included in control information 102 and used for the error correction coding by a transmitting device, such as information of a coding rate and a code length (block length), and outputs data 104 after the error correction coding.

Puncturing unit 105 receives an input of control information 102 and data 104 after the error correction coding, determines whether or not to puncture data 104 after the error correction coding based on the information of the code included in control information 102 and used for the error correction coding by the transmitting device, e.g., information of a coding rate and a code length (block length), and outputs data 106.

Interleaving unit 107 receives an input of control information 102 and data 106, rearranges data based on information included in control information 102 and related to an interleaving method, and outputs rearranged data 108.

Mapper 109 receives an input of control information 102 and rearranged data 108, performs mapping based on information included in control information 102 and related to a modulating method, and outputs baseband signal 110.

Radio unit 112 receives an input of control information 102, baseband signal 110 and pilot signal 111, generates a frame by performing processing of inserting a control information symbol modulated from control information 102 by a receiver (including information related to a modulation method or an error correction coding method), and a pilot symbol and the like into a data symbol, further performs signal processing based on control information 102 (e.g. signal processing based on OFDM (Orthogonal Frequency Division Multiplexing) when OFDM is used, signal processing based on a MIMO (Multiple Input-Multiple-Output) method when the MIMO method is used, or processing such as frequency conversion, band limitation or amplification), and outputs transmission signal 113. Transmission signal 113 is output as a radio wave from antenna 114 (in addition, a number of antennas described herein is two yet is not limited to this).

FIG. 1 illustrates an example of a configuration of receiving device 150 which receives a modulated signal transmitted from transmitting device 100.

Radio unit 153 performs processing such as frequency conversion on received signal 152 received at antenna 151, and outputs baseband signal 154.

Synchronizer 155 receives an input of baseband signal 154, performs processing for frequency synchronization and time synchronization by using a pilot symbol and a preamble included in a baseband signal, and outputs synchronization signal 156.

Channel estimator 157 receives an input of baseband signal 154, performs channel estimation by using a pilot symbol or a preamble included in a baseband signal, and outputs channel estimation signal 15.

Control information demodulator 159 receives an input of baseband signal 154, demodulates a control information symbol included in the baseband signal, and outputs control information signal 160.

Demodulator 161 receives an input of baseband signal 154, synchronization signal 156, channel estimation signal 158 and control information signal 160, calculates a log likelihood ratio of each bit of a data symbol included in baseband signal 154 by using synchronization signal 156 and channel estimation signal 158 based on information included in control information signal 160 and related to a transmitting method such as a modulating method, and outputs log likelihood ratio signal 162.

Deinterleaving unit 163 receives an input of control information signal 160 and log likelihood ratio signal 162, rearranges an order of log likelihood ratios based on information included in control information signal 160 and related to an interleaving method, and outputs rearranged log likelihood ratio signal 164.

Insertion unit 165 receives an input of control information signal 160, and determines whether the transmitting device has performed puncturing or has not performed the puncturing (whether the transmitting device has deleted part of a bit sequence or has not deleted part of the bit sequence) based on information of a block length (code length) and a coding rate of an error correction code of control information signal 160.

When determining that "the transmitting device has performed the puncturing", insertion unit 165 inserts into rearranged log likelihood ratio signal 164 a log likelihood ratio (e.g. a value of "0") corresponding to a bit punctured (deleted) by the transmitting device.

When determining that "the transmitting device has not performed the puncturing", insertion unit 165 does not perform insertion of the above log likelihood ratio.

Further, insertion unit 165 outputs second log likelihood ratio signal 166.

Decoder 167 receives an input of control information signal 160 and second log likelihood ratio signal 166, performs error correction decoding based on information included in the control information signal and related to an error correction code, and outputs received data 168. In addition, according to the present disclosure, the LDPC code is used. Therefore, belief propagation (BP) decoding (e.g. sum-product decoding, min-sum decoding or Laired BP decoding) is performed based on a parity check matrix.

Figure 2:
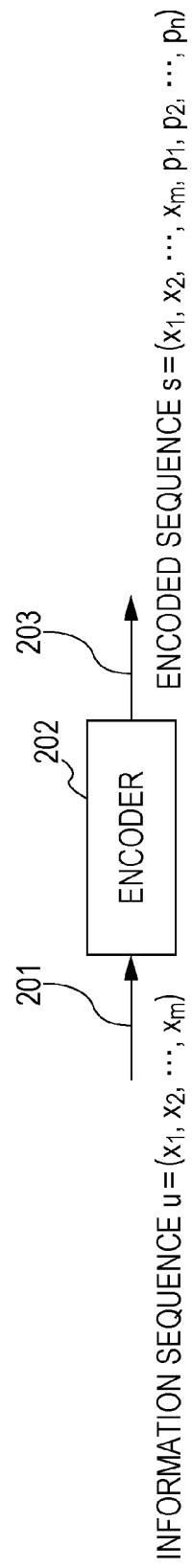
FIG. 2 is a view illustrating an example of a configuration of an encoder.

An LDPC code will be described. FIG. 2 illustrates a configuration of the encoder.

When an information sequence is $u=(x_1, x_2, \ldots, x_m)$ (201), an encoded sequence is $s=(x_1, x_2, \ldots, x_m, p_1, p_2, \ldots, p_n)$ (203) and a parity check matrix is H, a following equation holds (m is a natural number, and n is a natural number).

$$Hs^T = 0 \qquad \text{[Equation 1]}$$

By using a relationship of the above equation, encoder 202 receives an input of information sequence $u=(x_1, x_2, \ldots, x_m)$, and generates and outputs encoded sequence $s=(x_1, x_2, \ldots, x_m, p_1, p_2, \ldots, p_n)$. In addition, coding rate $R=m/(m+n)$ holds. In addition, $(p_1, p_2, \ldots, p_n)$ will be referred to as a parity sequence.

Hence, the transmitting device transmits m+n bits $(x_1, x_2, \ldots, x_m, p_1, p_2, \ldots, p_n)$ of one encoded block in total.

In this case, a number of rows of parity check matrix H is n, and a number of columns is m+n.

In addition, a case where encoding is performed as in FIG. 2 will be referred to as the "LDPC coding method which does not perform puncturing".

Next, the LDPC code which uses puncturing will be described.

Figure 3:
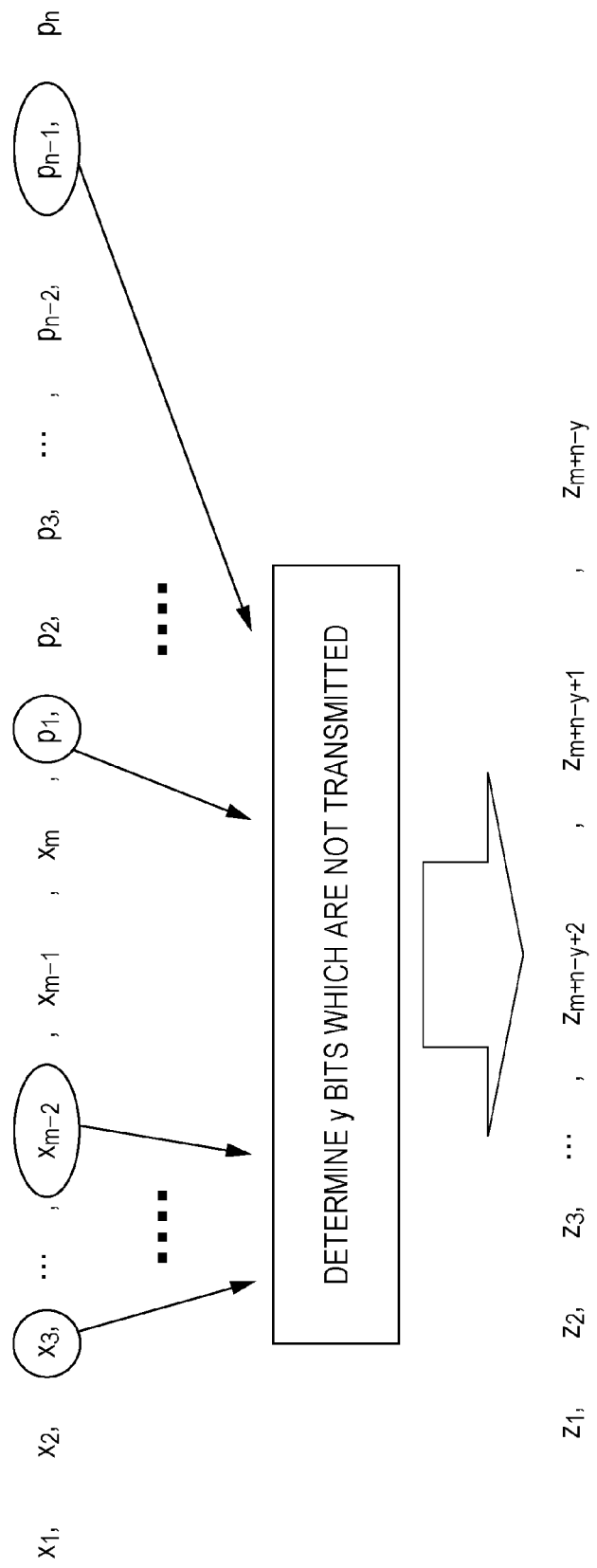
FIG. 3 is a view illustrating an example of an operation of the transmitting device when puncturing is used.

The transmitting device determines y bits which are not transmitted in encoded sequence $s=(x_1, x_2, \ldots, x_m, p_1, p_2, \ldots, p_n)$ of the above-described LDPC code, and then the transmitting device transmits a sequence of m+n−y bits other than the determined bits. FIG. 3 illustrates a specific example of the LDPC code which uses puncturing.

In FIG. 3, for example, the transmitting device selects y bits "$x_3, \ldots, x_{m-2}, p_1, \ldots, p_{n-1}$" in total, determines not to transmit these y bits, and transmits sequence of the m+n−y bits $z_1, z_2, z_3, \ldots, z_{m+n-y+2}, z_{m+n-y+1}, z_{m+n-y}$ in total other than the bits for which transmission has not been determined.

In addition, in an example in FIG. 3, the y bits which are not transmitted are selected from both of an information sequence and a parity sequence, yet are not limited to this and may be selected only from an information sequence or may be selected only from a parity sequence. That is, the y bits which are not transmitted may be selected from an encoded sequence in any way.

Hence, the transmitting device transmits the m+n−y bits $(z_1, z_2, z_3, \ldots, z_{m+n-y+2}, z_{m+n-y+1}, z_{m+n-y})$ of one encoded block in total.

In addition, hereinafter, the above-described method will be referred to as the "LDPC coding method which uses puncturing".

Figure 4:
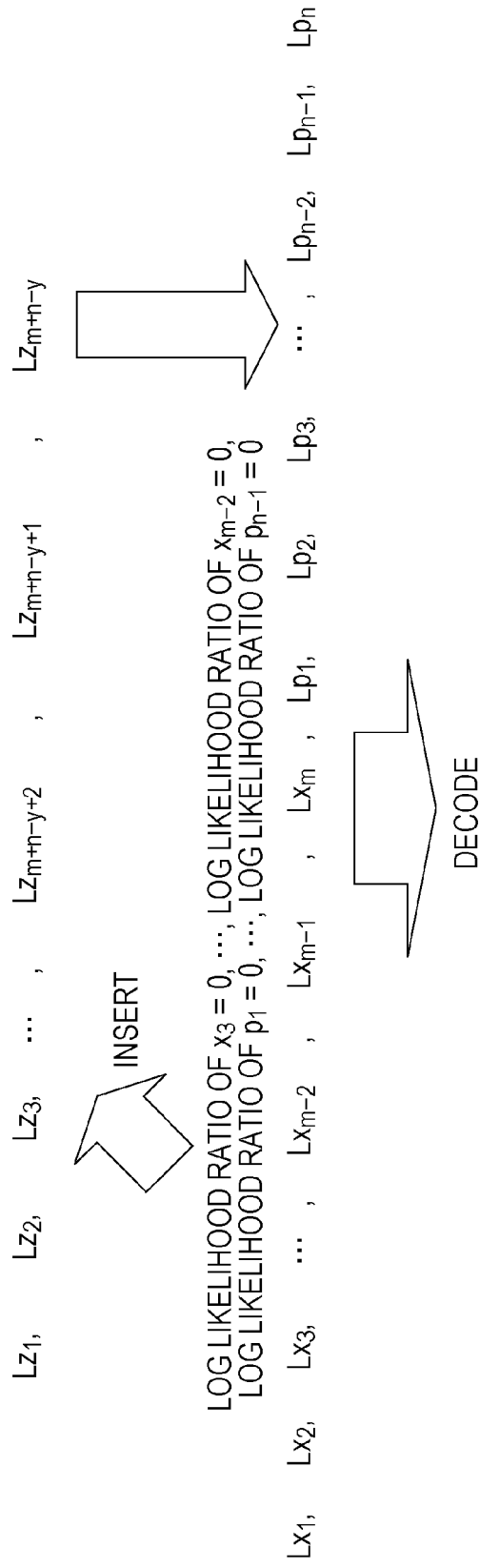
FIG. 4 is a view illustrating an example of an operation of the receiving device when puncturing is used.

FIG. 4 illustrates an example of an operation example of the receiving device when the transmitting device transmits data as illustrated in FIG. 3.

The receiving device receives sequence $z_1, z_2, z_3, \ldots, z_{m+n-y+2}, z_{m+n-y+1}, z_{m+n-y}$, and determines log likelihood ratios of these bits as $Lz_1, Lz_2, Lz_3, \ldots, Lz_{m+n-y+2}, Lz_{m+n-y+1}, Lz_{m+n-y}$.

As illustrated in FIG. 4, the receiving device sets to "0 (zero)" the log likelihood ratio of each bit of the y bits "$x_3, \ldots, x_{m-2}, p_1, \ldots, p_{n-1}$" in total which have not been transmitted by the transmitting device. Hence, the receiving device inserts "log likelihood ratio of $x_3=0, \ldots$, log likelihood ratio of $x_{m-2}=0$, log likelihood ratio of $p_1=0, \ldots$, log likelihood ratio of $p_{n-1}=0$". Hence, log likelihood ratios $Lx_1, Lx_2, Lx_3, \ldots, Lx_{m-2}, Lx_{m-1}, Lx_m, Lp_1, Lp_2, Lp_3, \ldots, Lp_{n-2}, Lp_{n-1}, Lp_n$ of bits $x_1, x_2, x_3, \ldots, x_{m-2}, x_{m-1}, x_m, p_1, p_2, p_3, \ldots, p_{n-2}, p_{n-1}, p_n$ are obtained. Further, the receiving device performs BP decoding by using $Lx_1, Lx_2, Lx_3, \ldots, Lx_{m-2}, Lx_{m-1}, Lx_m, Lp_1, Lp_2, Lp_3, \ldots, Lp_{n-2}, Lp_{n-1}, Lp_n$, and obtains received data.

Next, a case where the transmitting device supports $\alpha$ bits and $\beta$ bits as numbers of bits of one encoded block at coding rate $R=\gamma$. In addition, $\alpha$ and $\beta$ are natural numbers, and $\alpha<\beta$ holds.

In a case of "the LDPC coding method which uses puncturing", an LDPC code of $\alpha+v$ bits (in this regard, v is a natural number) of a code length (block length) and coding rate q (in this case, $q<\gamma$) is used for coding rate $R=\gamma$ and the $\alpha$ bits of one encoded block, and then puncturing is performed. In addition, this method will be referred to as "method #1".

Similarly, in the case of "the LDPC coding method which uses puncturing", an LDPC code of $\beta+u$ bits (in this regard, u is a natural number) of a code length (block length) and coding rate q (in this case, $q<\gamma$) is used for coding rate $R=\gamma$ and the $\beta$ bits of one encoded block. Subsequently, puncturing is performed. In addition, this method will be referred to as "method #2".

By contrast with this, in a case of "the LDPC coding method which does not perform puncturing", an LDPC code of the a bits of a code length (block length) and coding rate $\gamma$ is used for coding rate $R=\gamma$ and the $\alpha$ bits of one encoded block. In addition, this method will be referred to as "method #3".

Similarly, in the case of "the LDPC coding method which does not perform puncturing", an LDPC code of the $\beta$ bits of a code length (block length) and coding rate $\gamma$ is used for coding rate $R=\gamma$ and the $\beta$ bits of one encoded block. In addition, this method will be referred to as "method #4".

Under a condition that a relationship of $\alpha<\beta$ holds, discussion will be made.

In this case, when the number of bits of one encoded block is the $\alpha$ bits, there is a case where "method #1" provides higher data reception quality than data reception quality of "method #3".

In this case, when the number of bits of one encoded block is $\beta$, there is a case where "method #4" provides higher data reception quality than data reception quality of "method #2".

This reason will be described below.

In a case of "method #1", an LDPC code whose code length (block length) is $\alpha+v$ bits larger than $\alpha$ is used to realize the $\alpha$ bits as the number of bits of one encoded block. In this regard, in a case of $\alpha<\beta$ and small $\alpha$, the degree of contribution made by a value of v added to the $\alpha+v$ bits of the code length (block length) is great. Therefore, there is a case where, compared to a case where the LDPC code of the $\alpha$ bits of the code length (block length) is used, "method #1" can provide high data reception quality.

Meanwhile, in a case of "method #2", an LDPC code whose code length (block length) is $\beta+u$ bits larger than $\beta$ is used to realize the $\beta$ bits as the number of bits of one encoded block. In this regard, in a case of $\alpha<\beta$ and large $\beta$, the degree of contribution made by a value of u added to the $\beta+u$ bits of the code length (block length) is small, and puncturing causes significant deterioration. Hence, when an LDPC code whose number of bits is the $\beta$ bits of the code length (block length), there is a case where "method #4" provides higher data reception quality than data reception quality of "method #2".

In this regard, data reception quality depends on specific values of $\alpha$ and $\beta$. (Further, the values of $\alpha$ and $\beta$ are likely to change depending on a coding rate.) A specific example will be described below.

FIG. 5 illustrates an example of which one of "method #A" and "method #B" is used for a number of bits z and a coding rate of one encoded block. In addition, in a case of "method #A", a coding rate means a coding rate after puncturing (after bits which are not transmitted are deleted) instead of a coding rate of the LDPC code.

In the example in FIG. 5, in a case of one encoded block z=8100 bits, "method #A" realizes coding rates 5/15, 6/15, 7/15, 8/15, 9/15, 10/15, 11/15, 12/15 and 13/15.

Further, in a case of one encoded block z=16200 bits, "method #A" realizes coding rates 5/15, 6/15, 7/15, 8/15, 9/15, 10/15, 11/15, 12/15 and 13/15.

In a case of one encoded block z=64800 bits, "method #B" realizes coding rates 5/15, 6/15, 7/15, 8/15, 9/15, 10/15, 11/15, 12/15 and 13/15.

In this case, when a number of bits of one encoded block takes a given value, "method #A in a case of coding rate a" and "method #A in a case of coding rate b" (in this case, a≠b) will be described. (In this regard, coding rate a and coding rate b are both coding rates after puncturing (after bits which are not transmitted are deleted.)) In this case, there are a and b satisfying one of following conditions.

Condition 5-1: An LDPC code on which "method #A in a case of coding rate a" is based, and an LDPC code on which "method #A in a case of coding rate b" is based are different codes.

Condition 5-2: A parity check matrix of an LDPC code on which "method #A in a case of coding rate a" is based, and a parity check matrix of an LDPC code on which "method #A in a case of coding rate b" is based are different.

Condition 5-3: A number of rows of a parity check matrix of an LDPC code on which "method #A in a case of coding rate a" is based, and a number of rows of a parity check matrix of an LDPC code on which "method #A in a case of coding rate b" is based are different.

Condition 5-4: A number of columns of a parity check matrix of an LDPC code on which "method #A in a case of coding rate a" is based, and a number of columns of a parity check matrix of an LDPC code on which "method #A in a case of coding rate b" is based are different.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device set a coding rate from coding rates illustrated in FIG. 6, and select one encoded block from the number of bits of one encoded block illustrated in FIG. 6.

FIG. 6 illustrates an example of which one of "method #A" and "method #B" is used for a number of bits z and a coding rate of one encoded block. In addition, in a case of "method #A", a coding rate means a coding rate after puncturing (after bits which are not transmitted are deleted) instead of a coding rate of the LDPC code.

In the example in FIG. 6, in a case of one encoded block z=8100 bits, "method #A" realizes coding rates 5/15, 6/15, 7/15, 8/15, 9/15, 10/15, 11/15, 12/15 and 13/15.

Further, in a case of one encoded block z=16200 bits, "method #B" realizes coding rates 5/15, 6/15, 7/15, 8/15, 9/15, 10/15, 11/15, 12/15 and 13/15.

In a case of one encoded block z=64800 bits, "method #B" realizes coding rates 5/15, 6/15, 7/15, 8/15, 9/15, 10/15, 11/15, 12/15 and 13/15.

In this case, when a number of bits of one encoded block takes a given value, "method #A in a case of coding rate a" and "method #A in a case of coding rate b" (in this case, a≠b) will be described. (In this regard, coding rate a and coding rate b are both coding rates after puncturing (after bits which are not transmitted are deleted.)) In this case, there are a and b satisfying one of following conditions.

Condition 6-1: An LDPC code on which "method #A in a case of coding rate a" is based, and an LDPC code on which "method #A in a case of coding rate b" is based are different codes.

Condition 6-2: A parity check matrix of an LDPC code on which "method #A in a case of coding rate a" is based, and a parity check matrix of an LDPC code on which "method #A in a case of coding rate b" is based are different.

Condition 6-3: A number of rows of a parity check matrix of an LDPC code on which "method #A in a case of coding rate a" is based, and a number of rows of a parity check matrix of an LDPC code on which "method #A in a case of coding rate b" is based are different.

Condition 6-4: A number of columns of a parity check matrix of an LDPC code on which "method #A in a case of coding rate a" is based, and a number of columns of a parity check matrix of an LDPC code on which "method #A in a case of coding rate b" is based are different.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device set a coding rate from coding rates illustrated in FIG. 7, and select one encoded block from the number of bits of one encoded block illustrated in FIG. 7.

FIG. 7 illustrates an example of which one of "method #A" and "method #B" is used for the number of bits z and a coding rate of one encoded block. In addition, in a case of "method #A", a coding rate means a coding rate after puncturing (after bits which are not transmitted are deleted) instead of a coding rate of the LDPC code.

In the example in FIG. 7, when one encoded block z is between 1000 bits and 9000 bits, "method #A" realizes coding rates 5/15, 6/15, 7/15, 8/15, 9/15, 10/15, 11/15, 12/15 and 13/15.

Further, when one encoded block z is between 10000 bits and 20000 bits, "method #A" realizes coding rates 5/15, 6/15, 7/15, 8/15, 9/15, 10/15, 11/15, 12/15 and 13/15.

In a case of one encoded block z is between 50000 bits and 70000 bits, "method #B" realizes coding rates 5/15, 6/15, 7/15, 8/15, 9/15, 10/15, 11/15, 12/15 and 13/15.

In this case, when a number of bits of one encoded block takes a given value, "method #A in a case of coding rate a" and "method #A in a case of coding rate b" (in this case, a≠b) will be described. (In this regard, coding rate a and coding rate b are both coding rates after puncturing (after bits which are not transmitted are deleted.)) In this case, there are a and b satisfying one of following conditions.

Condition 7-1: An LDPC code on which "method #A in a case of coding rate a" is based, and an LDPC code on which "method #A in a case of coding rate b" is based are different codes.

Condition 7-2: A parity check matrix of an LDPC code on which "method #A in a case of coding rate a" is based, and a parity check matrix of an LDPC code on which "method #A in a case of coding rate b" is based are different.

Condition 7-3: A number of rows of a parity check matrix of an LDPC code on which "method #A in a case of coding rate a" is based, and a number of rows of a parity check matrix of an LDPC code on which "method #A in a case of coding rate b" is based are different.

Condition 7-4: A number of columns of a parity check matrix of an LDPC code on which "method #A in a case of coding rate a" is based, and a number of columns of a parity check matrix of an LDPC code on which "method #A in a case of coding rate b" is based are different.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device set a coding rate from coding rates illustrated in FIG. 8, and select one encoded block from the number of bits of one encoded block illustrated in FIG. 8.

FIG. 8 illustrates an example of which one of "method #A" and "method #B" is used for a number of bits z and a coding rate of one encoded block. In addition, in a case of "method #A", a coding rate means a coding rate after puncturing (after bits which are not transmitted are deleted) instead of a coding rate of the LDPC code.

In the example in FIG. 8, when the number of bits z of one encoded block is between 1000 bits and 9000 bits, "method #A" realizes coding rates 5/15, 6/15, 7/15, 8/15, 9/15, 10/15, 11/15, 12/15 and 13/15.

Further, when the number of bits z of one encoded block is between 10000 bits and 20000 bits, "method #B" realizes coding rates 5/15, 6/15, 7/15, 8/15, 9/15, 10/15, 11/15, 12/15 and 13/15.

In a case of one encoded block z is between 50000 bits and 70000 bits, "method #B" realizes coding rates 5/15, 6/15, 7/15, 8/15, 9/15, 10/15, 11/15, 12/15 and 13/15.

In this case, when a number of bits of one encoded block takes a given value, "method #A in a case of coding rate a" and "method #A in a case of coding rate b" (in this case, a≠b) will be described. (In this regard, coding rate a and coding rate b are both coding rates after puncturing (after bits which are not transmitted are deleted.)) In this case, there are a and b satisfying one of following conditions.

Condition 8-1: An LDPC code on which "method #A in a case of coding rate a" is based, and an LDPC code on which "method #A in a case of coding rate b" is based are different codes.

Condition 8-2: A parity check matrix of an LDPC code on which "method #A in a case of coding rate a" is based, and a parity check matrix of an LDPC code on which "method #A in a case of coding rate b" is based are different.

Condition 8-3: A number of rows of a parity check matrix of an LDPC code on which "method #A in a case of coding rate a" is based, and a number of rows of a parity check matrix of an LDPC code on which "method #A in a case of coding rate b" is based are different.

Condition 8-4: A number of columns of a parity check matrix of an LDPC code on which "method #A in a case of coding rate a" is based, and a number of columns of a parity check matrix of an LDPC code on which "method #A in a case of coding rate b" is based are different.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device select one encoded block from the number of bits of one encoded block illustrated in FIG. 9. In addition, a coding rate can also be set.

FIG. 9 illustrates an example of which one of "method #A" and "method #B" is used for the number of bits z of one encoded block. In addition, in a case of "method #A", a coding rate means a coding rate after puncturing (after bits which are not transmitted are deleted) instead of a coding rate of the LDPC code.

In the example in FIG. 9, when one encoded block z is less than 20000 bits, "method #A" is used.

Further, when one encoded block z is 20000 bits or more, "method #B" is used.

In this case, when a number of bits of one encoded block takes a given value, "method #A in a case of coding rate a" and "method #A in a case of coding rate b" (in this case, a≠b) will be described. (In this regard, coding rate a and coding rate b are both coding rates after puncturing (after bits which are not transmitted are deleted.)) In this case, there are a and b satisfying one of following conditions.

Condition 9-1: An LDPC code on which "method #A in a case of coding rate a" is based, and an LDPC code on which "method #A in a case of coding rate b" is based are different codes.

Condition 9-2: A parity check matrix of an LDPC code on which "method #A in a case of coding rate a" is based, and a parity check matrix of an LDPC code on which "method #A in a case of coding rate b" is based are different.

Condition 9-3: A number of rows of a parity check matrix of an LDPC code on which "method #A in a case of coding rate a" is based, and a number of rows of a parity check matrix of an LDPC code on which "method #A in a case of coding rate b" is based are different.

Condition 9-4: A number of columns of a parity check matrix of an LDPC code on which "method #A in a case of coding rate a" is based, and a number of columns of a parity check matrix of an LDPC code on which "method #A in a case of coding rate b" is based are different.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device select one encoded block from the number of bits of one encoded block illustrated in FIG. 10. In addition, a coding rate can also be set.

FIG. 10 illustrates an example of which one of "method #A" and "method #B" is used for the number of bits z of one encoded block. In addition, in a case of "method #A", a coding rate means a coding rate after puncturing (after bits which are not transmitted are deleted) instead of a coding rate of the LDPC code.

In the example in FIG. 10, when one encoded block z is less than 10000 bits, "method #A" is used.

Further, when one encoded block z is 10000 bits or more, "method #B" is used.

In this case, when a number of bits of one encoded block takes a given value, "method #A in a case of coding rate a" and "method #A in a case of coding rate b" (in this case, a≠b)

will be described. (In this regard, coding rate a and coding rate b are both coding rates after puncturing (after bits which are not transmitted are deleted.)) In this case, there are a and b satisfying one of following conditions.

Condition 10-1: An LDPC code on which "method #A in a case of coding rate a" is based, and an LDPC code on which "method #A in a case of coding rate b" is based are different codes.

Condition 10-2: A parity check matrix of an LDPC code on which "method #A in a case of coding rate a" is based, and a parity check matrix of an LDPC code on which "method #A in a case of coding rate b" is based are different.

Condition 10-3: A number of rows of a parity check matrix of an LDPC code on which "method #A in a case of coding rate a" is based, and a number of rows of a parity check matrix of an LDPC code on which "method #A in a case of coding rate b" is based are different.

Condition 10-4: A number of columns of a parity check matrix of an LDPC code on which "method #A in a case of coding rate a" is based, and a number of columns of a parity check matrix of an LDPC code on which "method #A in a case of coding rate b" is based are different.

Figure 11:
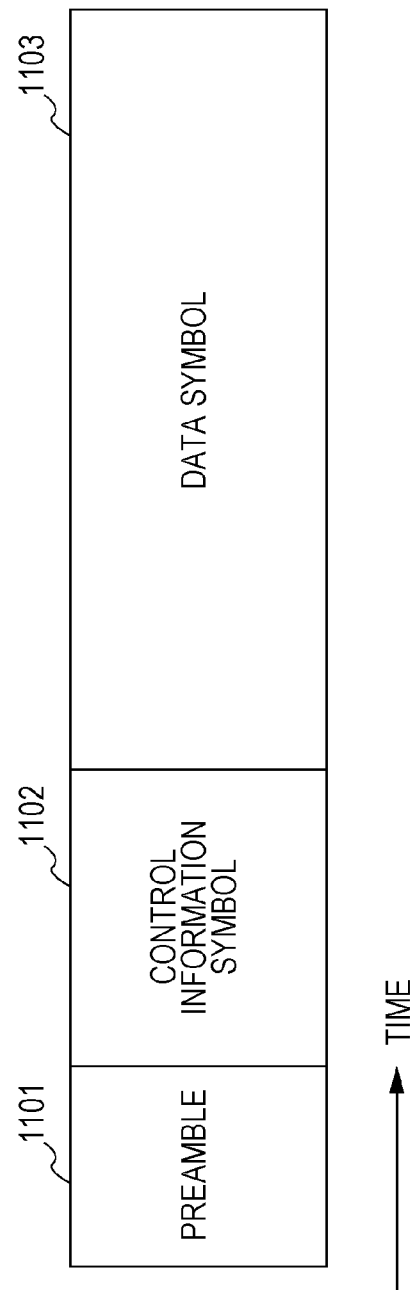
FIG. 11 is a view illustrating an example of a configuration of a frame transmitted by the transmitting device.

FIG. 11 is a view illustrating an example of a configuration of a frame transmitted by the transmitting device, in which a horizontal axis is a time. FIG. 11 illustrates an example where a transmitting method which uses a single carrier is used. However, when a multi-carrier method such as OFDM (Orthogonal Frequency Division Multiplexing) is used, there is a plurality of carriers in a frequency direction, and there are symbols in a carrier direction. Further, when space-time coding or a MIMO (Multiple Input-Multiple-Output) method is used, there is a frame per stream.

In FIG. 11, for preamble 1101, for example, a PSK (Phase Shift Keying) modulated symbol which is known between a transmitter and a receiver is used. The receiver performs frequency offset estimation, frequency synchronization, time synchronization, frame synchronization, channel estimation and signal detection by using this symbol.

Control information symbol 1102 includes, for example, information of an error correction code method (a code length, a block length, and a coding rate of one encoded block) used to generate a data symbol, information of a modulation method used to generate a data symbol, and information related to the transmitting method. The receiving device obtains the control information by demodulating this symbol, and, consequently, can perform demodulation and error correction decoding on the data symbol.

Further, control on whether or not a log likelihood ratio described with reference to FIG. 1 is inserted is performed based on the information obtained by control information symbol 1102.

Data symbol 1103 is generated based on an error correction coding method (a code length, a block length, and a coding rate of one encoded block), a modulating method and a transmitting method selected by the transmitting device. In addition, although not illustrated in FIG. 11, a symbol such as a pilot symbol may be inserted in symbols described as control information symbol 1102 and data symbol 1103.

Hence, a frame configuration is not limited to the configuration in FIG. 11.

The transmitting device can select a value of one encoded block of data to transmit from a plurality of values and provides a threshold. When one encoded block of data transmitted by the transmitting device is the threshold or more, the transmitting device selects "the LDPC coding method which does not perform puncturing", and when the one encoded block is less than the threshold, the transmitting device selects "the LDPC coding method which uses puncturing" to transmit data. Consequently, the receiving device can provide an advantage of providing higher data reception quality for each value of one encoded block.

Next, a case where the transmitting device supports coding rates $\alpha$, $\beta$ and $\gamma$ for numbers of bits $\delta$ of one encoded block. In addition, $\alpha$, $\beta$ and $\gamma$ take values larger than 0 and smaller than 1, and $\alpha<\beta<\gamma$ holds. In addition, a coding rate in a case of "the LDPC coding method which uses puncturing" means a coding rate after puncturing (after bits which are not transmitted are deleted).

In the case of "the LDPC coding method which uses puncturing", an LDPC code of $\delta+u$ bits (in this regard, u is a natural number) of a code length (block length) and coding rate a (in this case, $a<\alpha$) is used for coding rate $R=\alpha$ and the $\delta$ bits of one encoded block, and then puncturing is performed. In addition, this method will be referred to as "method $1".

Similarly, in the case of "the LDPC coding method which uses puncturing", an LDPC code of $\delta+v$ bits (in this regard, v is a natural number) of a code length (block length) and coding rate b (in this case, $b<\beta$) is used for coding rate $R=\beta$ and the $\delta$ bits of one encoded block, and then puncturing is performed. In addition, this method will be referred to as "method $2".

In the case of "the LDPC coding method which uses puncturing", an LDPC code of $\delta+w$ bits (in this regard, w is a natural number) of a code length (block length) and coding rate c (in this case, $c<\gamma$) is used for coding rate $R=\gamma$ and the $\delta$ bits of one encoded block, and then puncturing is performed. In addition, this method will be referred to as "method $3".

By contrast with this, in a case of "the LDPC coding method which does not perform puncturing", an LDPC code of $\delta$ bits of a code length (block length) and coding rate $\alpha$ is used for coding rate $R=\alpha$ and the $\delta$ bits of one encoded block. In addition, this method will be referred to as "method $4".

Similarly, in the case of "the LDPC coding method which does not perform puncturing", an LDPC code of the $\delta$ bits of a code length (block length) and coding rate $\beta$ is used for coding rate $R=\beta$ and the $\delta$ bits of one encoded block. In addition, this method will be referred to as "method $5".

In the case of "the LDPC coding method which does not perform puncturing", an LDPC code of the $\delta$ bits of a code length (block length) and coding rate $\gamma$ is used for coding rate $R=\gamma$ and the $\delta$ bits of one encoded block. In addition, this method will be referred to as "method $6".

Under a condition that a relationship of $\alpha<\beta<\gamma$ holds, discussion will be made.

In this case, when the coding rate is lower than $\alpha$, there is a case where "method $4" provides higher data reception quality than data reception quality "method $1".

When the coding rate takes an intermediate value like $\beta$, there is a case where "method $2" provides higher data reception quality than data reception quality "method $5".

When the coding rate is higher than $\gamma$, there is a case where "method $6" provides higher data reception quality than data reception quality "method $3".

This reason will be described below.

Performance of an LDPC code of a low coding rate tends to have an expanding difference between Shannon limits. Hence, in a case of a small (low) coding rate such as coding rate $\alpha$ and in a case of "method $1", a coding rate of a base LDPC code is smaller than $\alpha$. Therefore, a difference between Shannon limits is great and, when puncturing is performed, it is difficult to provide good data reception quality.

In a case of an intermediate coding rate such as coding rate β and in a case of "method $2", there is a great difference between a Shannon limit of the coding rate of the base LDPC code and a Shannon limit of the punctured coding rate. Hence, performance of the base LDPC code makes contribution, and "method $2" is highly likely to provide high data reception quality.

In a case of a high coding rate such as coding rate γ and in a case of "method $3", there is a small difference between a Shannon limit of the coding rate of the base LDPC code and the Shannon limit of the punctured coding rate. Hence, "method $3" is likely to have difficulty in providing high data reception quality. However, compared to "method $6", "method $3" has an advantage of being capable of using a sparse parity check matrix. Consequently, "method $3" is likely to provide good reception quality.

In this regard, data reception quality depends on specific values of α, β and γ. (Further, the values of α, β and γ are likely to change depending on a value of one encoded block.) A specific example will be described below.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device select a coding rate from coding rates illustrated in FIG. 12. In addition, the number of bits of one encoded block can also be set.

FIG. 12 illustrates an example of which one of "method #A" and "method #B" is used when the number of bits z is set to a given value. In addition, in a case of "method #A", a coding rate means a coding rate after puncturing (after bits which are not transmitted are deleted) instead of a coding rate of the LDPC code.

In FIG. 12, e and f are larger than 0 and smaller than 1, and e<f holds.

In an example in FIG. 12, when the coding rate is less than f in a case of one encoded block z (z is a natural number), "method #B" is used.

Further, when the coding rate is e or more in a case of one encoded block z (z is a natural number), "method #A" is used.

Furthermore, when the coding rate is higher than f in a case of one encoded block z (z is a natural number), "method #B" is used.

There are a and b satisfying the coding rates between e and f, and the transmitting device can select "method #A in a case of coding rate a" and "method #A in a case of coding rate b". (In this regard, coding rate a and coding rate b are both coding rates after puncturing (after bits which are not transmitted are deleted.)) (In this regard, a≠b holds).

In this case, there are a and b satisfying one of following conditions.

Condition 12-1: An LDPC code on which "method #A in a case of coding rate a" is based, and an LDPC code on which "method #A in a case of coding rate b" is based are different codes.

Condition 12-2: A parity check matrix of an LDPC code on which "method #A in a case of coding rate a" is based, and a parity check matrix of an LDPC code on which "method #A in a case of coding rate b" is based are different.

Condition 12-3: A number of rows of a parity check matrix of an LDPC code on which "method #A in a case of coding rate a" is based, and a number of rows of a parity check matrix of an LDPC code on which "method #A in a case of coding rate b" is based are different.

Condition 12-4: A number of columns of a parity check matrix of an LDPC code on which "method #A in a case of coding rate a" is based, and a number of columns of a parity check matrix of an LDPC code on which "method #A in a case of coding rate b" is based are different.

In addition, "the number of bits z of one encoded block is set to a given value".

Hence, there is one or more types of coding rates which are less than f, there are two or more types of coding rates which are between e and f and there is one or more types of coding rates which are higher than f.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device select a coding rate from coding rates illustrated in FIG. 13. In addition, the number of bits of one encoded block can also be set.

FIG. 13 illustrates an example of which one of "method #A" and "method #B" is used for the number of bits z of one encoded block. In addition, in a case of "method #A", a coding rate means a coding rate after puncturing (after bits which are not transmitted are deleted) instead of a coding rate of the LDPC code.

In FIG. 13, g is larger than 0 and is smaller than 1.

In an example in FIG. 13, when the coding rate is less than g in the case of one encoded block z (z is a natural number), "method #B" is used.

Further, when the coding rate is g or more in the case of one encoded block z (z is a natural number), "method #A" is used.

There are a and b satisfying coding rate g or more, the transmitting device can select "method #A in a case of coding rate a" and "method #A in a case of coding rate b". (In this regard, coding rate a and coding rate b are both coding rates after puncturing (after bits which are not transmitted are deleted.)) (In this regard, a≠b holds). In this case, there are a and b satisfying one of following conditions.

Condition 13-1: An LDPC code on which "method #A in a case of coding rate a" is based, and an LDPC code on which "method #A in a case of coding rate b" is based are different codes.

Condition 13-2: A parity check matrix of an LDPC code on which "method #A in a case of coding rate a" is based, and a parity check matrix of an LDPC code on which "method #A in a case of coding rate b" is based are different.

Condition 13-3: A number of rows of a parity check matrix of an LDPC code on which "method #A in a case of coding rate a" is based, and a number of rows of a parity check matrix of an LDPC code on which "method #A in a case of coding rate b" is based are different.

Condition 13-4: A number of columns of a parity check matrix of an LDPC code on which "method #A in a case of coding rate a" is based, and a number of columns of a parity check matrix of an LDPC code on which "method #A in a case of coding rate b" is based are different.

In addition, "the number of bits z of one encoded block is set to a given value" as described above.

Hence, it is desirable that there is one or more types of coding rates which are less than g, and two or more types of coding rates which are g or more.

A number of bits of one encoded block is z bits. In addition, z is a natural number.

z bits of one encoded block are realized by using an "LDPC coding method which uses puncturing". In addition, this method will be referred to as "method #A".

z bits of one encoded block are realized by using an "LDPC coding method which does not perform puncturing". In addition, this method will be referred to as "method #B".

The transmitting device and the receiving device select a coding rate from coding rates illustrated in FIG. 14. In addition, the number of bits of one encoded block can also be set.

FIG. 14 illustrates an example of which one of "method #A" and "method #B" is used for the number of bits z of one encoded block. In addition, in a case of "method #A", a coding rate means a coding rate after puncturing (after bits which are not transmitted are deleted) instead of a coding rate of the LDPC code.

In FIG. 14, h is larger than 0 and is smaller than 1.

In an example in FIG. 14, when the coding rate is less than h in the case of one encoded block z (z is a natural number), "method #A" is used.

Further, when the coding rate is h or more in the case of one encoded block z (z is a natural number), "method #B" is used.

There are a and b satisfying a coding rate less than h, the transmitting device can select "method #A in a case of coding rate a" and "method #A in a case of coding rate b". (In this regard, coding rate a and coding rate b are both coding rates after puncturing (after bits which are not transmitted are deleted.)) (In this regard, a≠b holds). In this case, there are a and b satisfying one of following conditions.

Condition 14-1: An LDPC code on which "method #A in a case of coding rate a" is based, and an LDPC code on which "method #A in a case of coding rate b" is based are different codes.

Condition 14-2: A parity check matrix of an LDPC code on which "method #A in a case of coding rate a" is based, and a parity check matrix of an LDPC code on which "method #A in a case of coding rate b" is based are different.

Condition 14-3: A number of rows of a parity check matrix of an LDPC code on which "method #A in a case of coding rate a" is based, and a number of rows of a parity check matrix of an LDPC code on which "method #A in a case of coding rate b" is based are different.

Condition 14-4: A number of columns of a parity check matrix of an LDPC code on which "method #A in a case of coding rate a" is based, and a number of columns of a parity check matrix of an LDPC code on which "method #A in a case of coding rate b" is based are different.

In addition, "the number of bits z of one encoded block is set to a given value".

Hence, it is desirable that there is two or more types of coding rates which are less than h, and one or more types of coding rates which are h or more.

The operations of the transmitting device and the receiving device have been described above with reference to FIGS. 1 and 11.

The transmitting device sets a value of one encoded block of data to be transmitted, to a predetermined value, and provides a threshold. The transmitting device selects "the LDPC coding method which does not perform puncturing" when a coding rate is the threshold or more, and selects "the LDPC coding method which uses puncturing" when the one encoded block is less than the threshold. Alternatively, the transmitting device selects "the LDPC coding method which uses puncturing" when the coding rate is the threshold or more, and selects "the LDPC coding method which does not perform puncturing" when the coding rate is less than the threshold. Consequently, the receiving device can provide an advantage of providing higher data reception quality at any coding rate.

The transmitting method, the receiving method, the transmitting device and the receiving device according to the present disclosure provide high error correction performance and, consequently, can secure high data reception quality.

What is claimed is:

1. A transmitting method comprising:
selecting one coding scheme from a predetermined coding scheme set;
generating a plurality of information bit sequences by dividing transmission data;
performing an encoding process on each of the plurality of information bit sequences by using the selected coding scheme to generate a plurality of encoded bit sequences;
modulating the plurality of encoded bit sequences to generate transmission symbols; and
transmitting a transmission frame onto which the transmission symbols are allocated, wherein
the predetermined coding scheme set includes first coding schemes of a first code length and second coding schemes of a second code length, code rates of the first coding schemes are different from each other, code rates of the second coding schemes are different from each other,
when one of the first coding schemes is selected, the encoding process includes (i) generating a first code word as the encoded bit sequence from the information bit sequence according to a parity check matrix for the selected coding scheme,
when one of the second coding schemes is selected, the encoding process includes (i) generating a second code word from the information bit sequence according to a parity check matrix for the selected coding scheme, (ii) discarding a part of the second code word to generate a third code word, and (iii) outputting the third code word as the encoded bit sequence.

2. A transmitting apparatus comprising:
a controller that, in operation, selects one coding scheme from a predetermined coding scheme set;
an encoder that, in operation, generates a plurality of information bit sequences by dividing transmission data, and performs an encoding process on each of the plurality of information bit sequences by using the selected coding scheme to generate a plurality of encoded bit sequences;
a modulator that, in operation, modulates the plurality of encoded bit sequences to generate transmission symbols; and
a transmitter that, in operation, transmits a transmission frame onto which the transmission symbols are allocated, wherein the predetermined coding scheme set includes first coding schemes of a first code length and second coding schemes of a second code length, code rates of the first coding schemes are different from each other, code rates of the second coding schemes are different from each other, when one of the first coding schemes is selected, the encoding process includes (i) generating a first code word as the encoded bit sequence from the information bit sequence according to a parity check matrix for the selected coding scheme, when one of the second coding schemes is selected, the encoding process includes (i) generating a second code word from the information bit sequence according to a parity check matrix for the selected coding scheme, (ii) discarding a part of the second code word to generate a third code word, and (iii) outputting the third code word as the encoded bit sequence.

\* \* \* \* \*